(12) United States Patent
Walsh et al.

(10) Patent No.: US 6,844,781 B1
(45) Date of Patent: Jan. 18, 2005

(54) DUAL DIFFERENTIAL-INPUT AMPLIFIER HAVING WIDE INPUT RANGE

(75) Inventors: Joseph Walsh, Pocatello, ID (US); Stan Latimer, Pocatello, ID (US)

(73) Assignee: AMI Semiconductor, Inc., Pocatello, ID (US)

( * ) Notice: Subject to any disclaimer, the term of this patent is extended or adjusted under 35 U.S.C. 154(b) by 0 days.

(21) Appl. No.: 10/615,440

(22) Filed: Jul. 7, 2003

(51) Int. Cl.[7] .............................................. H03F 3/45
(52) U.S. Cl. ...................... 330/252; 330/253; 330/257
(58) Field of Search ................................ 330/252, 253, 330/257, 295; 327/563

(56) References Cited

U.S. PATENT DOCUMENTS

| | | | |
|---|---|---|---|
| 4,585,961 A | 4/1986 | Daubert ..................... | 307/491 |
| 4,825,100 A | 4/1989 | Caspell ..................... | 307/279 |
| 4,859,872 A | 8/1989 | Hyakutake ................ | 307/269 |
| 4,859,961 A | 8/1989 | Davenport ................ | 330/253 |
| 5,142,244 A | 8/1992 | Glica et al. ............... | 330/253 |
| 5,789,949 A | 8/1998 | Giordano et al. .......... | 327/63 |
| 6,124,759 A | 9/2000 | Migliavacca .............. | 330/253 |
| 6,181,169 B1 | 1/2001 | Hu ............................ | 327/77 |
| 6,191,619 B1 * | 2/2001 | Moreland et al. .......... | 326/126 |
| 6,252,435 B1 * | 6/2001 | Wu et al. .................... | 327/65 |
| 6,696,894 B1 * | 2/2004 | Huang ....................... | 330/253 |

OTHER PUBLICATIONS

ISBN 0–7803–3416–7 Baker, R. Jacob CMOS circuit design, layout, and simulation/ R. Jacob Baker, Harry W. Li, and David E. Boyce (IEEE Press series on microelectronic systems) 1997, p. 643.
CMOS Analog Circuit Design; Phillip E. Allen & Douglas R. Holberg 1987 Copyright Holt, Rinehart and Winston p 356 & 410.

* cited by examiner

*Primary Examiner*—Steven J. Mottola
(74) *Attorney, Agent, or Firm*—Workman Nydegger

(57) ABSTRACT

A dual differential-input operational amplifier that includes six PMOSFETs having their source terminals coupled to a high voltage. A seventh and eighth PMOSFET have their source terminals coupled to a current source. Four NMOSFETs have their source terminals coupled to a low voltage. A fifth and sixth NMOSFET have their source terminals coupled to a current sink. The various PMOSFETs and NMOSFETs are coupled together such that the gate terminals of the fifth NMOSFET and eighth PMOSFET receive a first input of the differential input, and such that the gate terminals of the sixth NMOSFET and the seventh PMOSFET receive a second input of the differential input. The operational amplifier may be vertically inverted, or implemented by bipolar transistors, with cascoding devices, and with a second stage in the form of an inverter.

20 Claims, 4 Drawing Sheets

DUAL DIFFERENTIAL-INPUT AMPLIFIER HAVING WIDE INPUT RANGE

BACKGROUND OF THE INVENTION

1. The Field of the Invention

The present invention relates to analog circuit design, and more specifically, to dual differential-input amplifiers and comparators having wide input range.

2. Background and Related Art

Analog circuits have revolutionized the way people work and play and have contributed enormously to the advancement of humankind. A key component of many analog circuit designs is the operational amplifier. An operational amplifier is a type of amplifier that when appropriately configured with external elements may perform mathematical operations. For example, an operational amplifier having it output coupled to an inverter causes the operational amplifier and inverter combination to act as a comparator in which the binary value at the output of the inverter is representative of which of the operational amplifier input terminals has a higher voltage.

In a standard differential-input operational amplifier, each of two differential input terminals is coupled to a control terminal of a single transistor (e.g., the gate terminal of a Metal-Oxide-Semiconductor Field-Effect Transistor (MOSFET), or the base terminal of a bipolar transistor). Dual differential-input operational amplifiers are useful in some applications as they have a tendency towards a wider input range. In dual differential-input operational amplifiers, each of two differential input terminals is coupled to a control terminal of two transistors. Wide input range is a desirable feature for many analog circuit applications as is know to those of ordinary skill in the art.

There are many conventional dual differential-input amplifier designs. Each design has its advantages and disadvantages. The desirability of the advantage and the acceptability of the disadvantage depend heavily upon the application. Additional alternatives provide a wider selection from which circuit designers may choose. Accordingly, what would be advantageous would be a new design for a dual differential-input operational amplifier.

BRIEF SUMMARY OF THE INVENTION

The principles of the present invention are directed towards a unique design for a dual differential-input operational amplifier. The circuit includes six P-type Metal-Oxide-Semiconductor Field-Effect Transistors (PMOSFETs) that each have their source terminals coupled to a high voltage rail. A seventh and eighth PMOSFET each have their source terminals coupled to a current source. Four N-type Metal-Oxide-Semiconductor Field-Effect Transistors (NMOSFETs) each have their source terminals coupled to a low voltage rail. A fifth and sixth NMOSFET each have their source terminals coupled to a current sink that draws an equal amount of current as the current source supplies.

The drain terminal of a first PMOSFET is coupled to the drain terminal of the first NMOSFET, to its own gate terminal, and to the gate terminal of the sixth PMOSFET. The drain terminal of a second PMOSFET is coupled to the gate terminals of both the first and second NMOSFETs, and to the drain terminal of both the second NMOSFET and the seventh PMOSFET. The drain terminal of the third PMOSFET is coupled to the gate terminals of both the second and third PMOSFETs, and to the drain terminal of the fifth NMOSFET. The drain terminal of the fourth PMOSFET is coupled to the gate terminals of both the fourth and fifth PMOSFETs, and to the drain terminal of the sixth NMOSFET. The drain terminal of the fifth PMOSFET is coupled to the gate terminals of both the third and fourth NMOSFETs, and to the drain terminals of both the third NMOSFET and the eighth PMOSFET. The drain terminal of the sixth PMOSFET is coupled to the drain terminal of the fourth NMOSFET and to the output terminal of the dual differential-input operational amplifier.

The gate terminals of the fifth NMOSFET and the eighth PMOSFET are configured to receive the first part of a differential input signal, while the gate terminals of the sixth NMOSFET and the seventh PMOSFET are configured to receive the second part of the differential input signal.

Optionally, an inverter may be coupled to the dual differential-input operational amplifier with the input terminal of the inverter connected to the output terminal of the amplifier to create a dual differential-input comparator. Also, the PMOSFETs may be replaced by PNP bipolar transistors, and NMOSFETs may be replaced by NPN bipolar transistors to generate a bipolar version of the circuit. The circuit may also be vertically inverted with the MOSFET and/or bipolar transistors being replaced by polar opposites (e.g., p-type MOSFETs for n-type MOSFETs and vice versa) to generate additional embodiments. Additionally, cascoded MOSFETS may be disposed between the sixth PMOSFET and the output terminal and between the fourth NMOSFET and the output terminal to thereby increase the gain of the operational amplifier.

The resulting circuit is a dual differential-input operational amplifier (or comparator) with a wide input voltage range. Specifically, the input voltage may vary from the low supply voltage to the high supply voltage while retaining the functionality of the amplifier.

Secondly, the circuit has a relatively symmetric design, which lends itself well to a more symmetric layout. This permits better device matching during layout to thereby reduce the impact of processing and temperature variations throughout the die.

Thirdly, the input structure is configured as a low gain stage with self biased loads. When the amplifier is configured with an inverter to form a comparator, the input structure prevents feedback through the differential pair transistors when the comparator transitions from one binary output state to another. This is due to the low impedance loads in the differential pair. This feature allows the user to use very high sources impedance for the circuit driving the comparator without corrupting the data. This contrasts with many conventional comparators which generate noise in the reference circuits when the comparator makes a transition.

Fourthly, the circuit has a less complex bias mechanism and could be used with a synthesis tool to program the comparator to fit many applications. This would allow the amplifier and associated comparator to be used in a wide range of applications without having to make a change to the circuit topology or layout database.

Fifthly, the dual differential-input effect is accomplished with relatively few transistors thereby reducing the complexity and size of the circuit as a whole.

Additional features and advantages of the invention will be set forth in the description that follows, and in part will be obvious from the description, or may be learned by the practice of the invention. The features and advantages of the invention may be realized and obtained by means of the instruments and combinations particularly pointed out in the appended claims. These and other features of the present invention will become more fully apparent from the following description and appended claims, or may be learned by the practice of the invention as set forth hereinafter.

BRIEF DESCRIPTION OF THE DRAWINGS

In order to describe the manner in which the above-recited and other advantages and features of the invention can be obtained, a more particular description of the invention briefly described above will be rendered by reference to specific embodiments thereof which are illustrated in the appended drawings. Understanding that these drawings depict only typical embodiments of the invention and are not therefore to be considered to be limiting of its scope, the invention will be described and explained with additional specificity and detail through the use of the accompanying drawings in which.

DETAILED DESCRIPTION OF THE PREFERRED EMBODIMENTS

The principles of the present invention are directed towards a unique design for a dual differential-input operational amplifier that permits wide input range, and symmetric design and layout.

Figure 1:
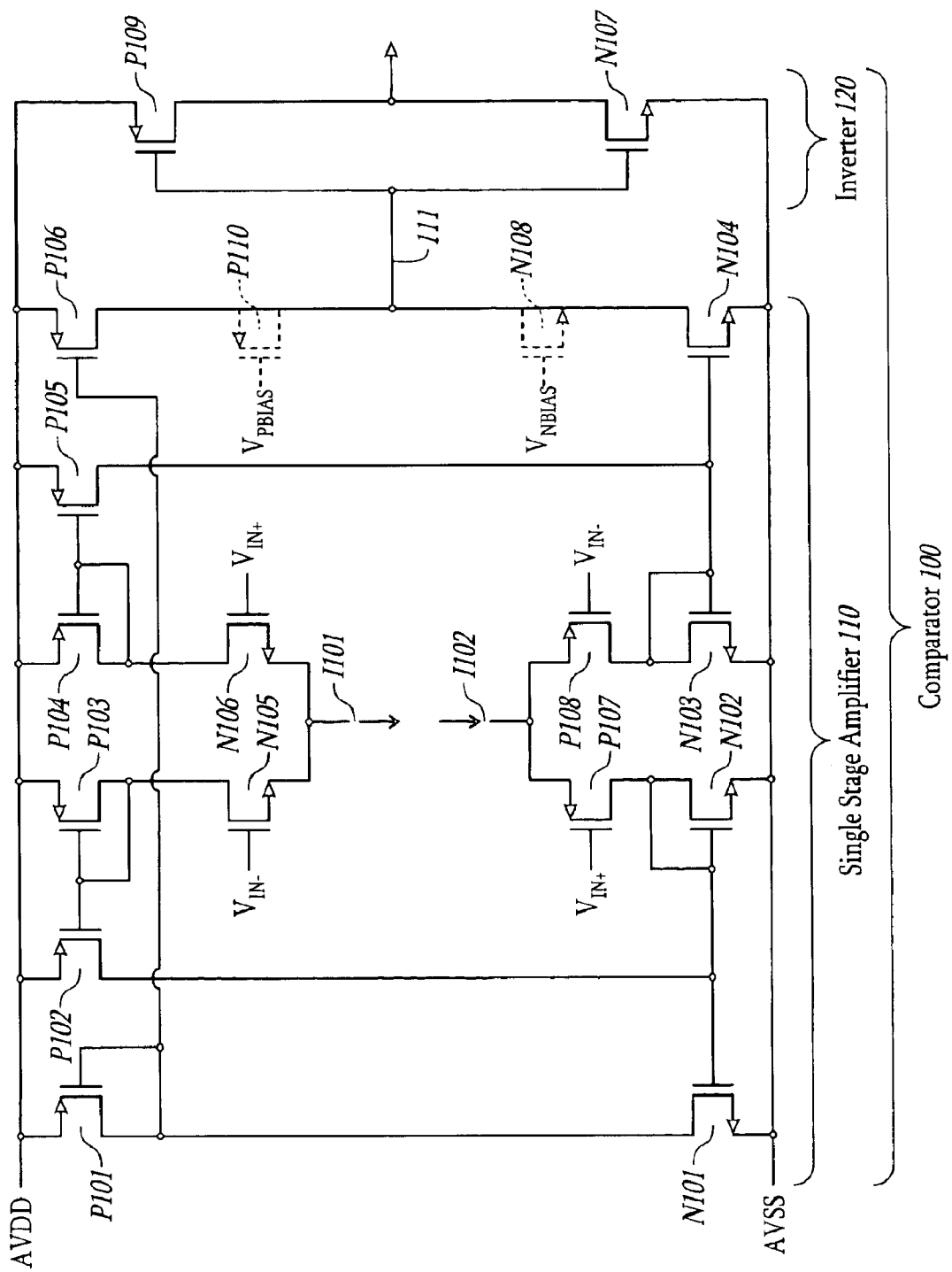
FIG. 1 illustrates a transistor-level diagram of a dual differential-input operational amplifier and comparator that is based upon Metal-Oxide-Semiconductor Field-Effect Transistors (MOSFETs) in accordance with a first embodiment of the present invention.

FIG. 1 illustrates a dual differential-input operational amplifier 110 that operates with an inverter 120 to form a dual differential-input comparator 100. The dual differential-input comparator 100 is based on Metal-Oxide Semiconductor Field-Effect Transistors (MOSFETs). P-channel or P-type MOSFETs will also be referred to herein as "PMOSFETs", while N-channel or N-type MOSFETs will also be referred to herein as "NMOSFETs".

The dual differential-input operational amplifier 110 includes six PMOSFETs P101 through P106 that each have their source terminals coupled to a high voltage rail AVDD. A seventh and eighth PMOSFET P107 and P108 each have their source terminals coupled to a current source I102. Four NMOSFETs N101 through N104 each have their source terminals coupled to a low voltage rail AVSS. A fifth and sixth NMOSFET N105 and N106 each have their source terminals coupled to a current sink I101 that draws about an equal amount of current as the current source I102 supplies.

The drain terminal of a first PMOSFET P101 is coupled to the drain terminal of the first NMOSFET N101, to its own gate terminal, and to the gate terminal of the sixth PMOSFET P106. The drain terminal of a second PMOSFET P102 is coupled to the gate terminals of both the first and second NMOSFETs N101 and N102, and to the drain terminals of both the second NMOSFET N102 and the seventh PMOSFET P107. The drain terminal of the third PMOSFET P103 is coupled to the gate terminals of both the second and third PMOSFETs P102 and P103, and to the drain terminal of the fifth NMOSFET N105. The drain terminal of the fourth PMOSFET P104 is coupled to the gate terminals of both the fourth and fifth PMOSFETs P104 and P105, and to the drain terminal of the sixth NMOSFET N106. The drain terminal of the fifth PMOSFET P105 is coupled to the gate terminals of both the third and fourth NMOSFETs N103 and N104, and to the drain terminals of both the third NMOSFET N103 and the eighth PMOSFET P108. The drain terminal of the sixth PMOSFET P106 is coupled to the drain terminal of the fourth NMOSFET N104 and to the output terminal of the dual differential-input operational amplifier 111.

The gate terminals of the fifth NMOSFET N105 and the eighth PMOSFET P108 are configured to receive the first part (VIN−) of a differential input signal, while the gate terminals of the sixth NMOSFET N106 and the seventh PMOSFET P107 are configured to receive the second part (VIN+) of the differential input signal. To increase the gain of the operational amplifier 111, cascoded MOSFETS may be disposed between the sixth PMOSFET P106 and the output terminal 111 and between the fourth NMOSFET N104 and the output terminal 111. For example, cascoded PMOSFET P110 may optionally be disposed between PMOSFET P106 and output terminal 111. Furthermore, cascoded NMOSFET N108 may optionally be disposed between NMOSFET N104 and the output terminal 111.

Optionally, an inverter 120 may be coupled to the dual differential-input operational amplifier with the input terminal of the inverter connected to the output terminal 111 of the operational amplifier 110 to create a dual differential-input comparator. For instance, the inverter 120 may include a ninth PMOSFET P109 that includes a source terminal coupled to the high voltage source AVDD, a gate terminal coupled to the output terminal 111 of the operational amplifier 110, and a drain terminal coupled to the output terminal of the inverter 120 and the dual differential-input comparator 100. A seventh NMOSFET N107 includes a source terminal coupled to the low voltage source AVSS, a gate terminal coupled to the output terminal 111 of the operational amplifier 110, and a drain terminal coupled to the output terminal of the inverter 120 and the dual differential-input comparator 100.

In one embodiment of the invention, the length-to-width ratios and M factors of the various transistors illustrated in FIG. 1 are as illustrated in Table 1 below:

TABLE 1

| Transistor | Length-to-Width Ratio (L/W) ($\mu m/\mu m$) | M Factor |
| --- | --- | --- |
| P101 | 40/5 | 1 |
| P102 | 40/5 | 1 |
| P103 | 40/5 | 1 |
| P104 | 40/5 | 1 |
| P105 | 40/5 | 1 |
| P106 | 40/5 | 2 |
| P107 | 150/4 | 1 |
| P108 | 150/4 | 1 |
| P109 | 20/0.6 | 1 |
| N101 | 20/5 | 1 |
| N102 | 20/5 | 1 |

TABLE 1-continued

| Transistor | Length-to-Width Ratio (L/W) (μm/μm) | M Factor |
|---|---|---|
| N103 | 20/5 | 1 |
| N104 | 20/5 | 2 |
| N105 | 75/4 | 1 |
| N106 | 75/4 | 1 |
| N107 | 6/0.6 | 1 |

Length-to-Width ratio refers to the designed length of the channel region in microns to the designed width of the channel region in microns. "M" factor refers to the number of such transistors in parallel. An M factor of 1 is just a single transistor having the specified length-to-width ratio. An M factor of 2 represents two transistors with their channel regions being electrically parallel and each having the specified length-to-width ratio.

The comparator 110 operates using a complex application of the principles of current mirroring. Under the principles of current mirroring, the current passing through the channel region of a mirroring MOSFET is mirrored into the channel region of a one or more mirrored MOSFET if certain conditions are true. In particular, the conditions are that the mirroring and mirrored MOSFETs are all operating in the active region, that the gate terminals of the mirroring and mirrored MOSFETs are shared, that the drain terminal of the mirroring MOSFET is coupled to the common gate terminal, and that the MOSFETs have the same polarity (e.g., n-type versus p-type). Under these conditions, the amount of current mirroring is approximately linearly proportional to the ratio of the length-to-width ratio of the mirrored MOSFET to the length-to-width ratio of the mirroring MOSFET. Similar current mirroring may occur with bipolar transistors. The principles of current mirroring are well known to those of ordinary skill in the art with respect to both MOSFETs and bipolar transistors.

Referring to FIG. 1, the comparator 100 works as follows assuming the length-to-width ratios given in Table 1 and assuming that I101 equals I102. For clarity, the current through the channel region of a transistor identified by X will be represented as I(X), where X may be any of transistors P101 through P109 and N101 through N107. For example, the current passing through the channel region of transistor P106 would be represented as I(P106).

The circuit operation will first be described when $V_{IN}+$ is greater than $V_{IN}-$. Transistor N106 will be on and conducting current, I101, through it. At the same time, N105 will be off. Transistors P104 and P105 compose a current mirror as do transistors P103 and P102. Since transistor N106 is on, current will be flowing through P104 which is then mirrored into transistor P105. Since transistor N105 is off, no current will be flowing through transistors P103 and P102.

On the bottom side of the circuit, transistor P108 will be on and transistor P107 will be off. The current, I102, will be flowing into transistor N103. Also, the current from transistor P105 is flowing into transistor N103. Therefore, the current flowing into transistor N103 is the sum of the currents from transistors P108 and P105. Transistors N103 and N104 also form a current mirror. The size of transistor N104 is twice that of transistor N103 so the current flowing through transistor N104 can be described as follows in equation 1:

$$I(N104)=2*I(N103)=2*[I(P108)+I(P105)] \quad (1)$$

The other half of the circuit is off since $V_{IN}+$ is greater than $V_{IN}-$. Transistor N105 is off and no current is flowing through transistor P103. Since transistors P103 and P102 form a current mirror, no current is flowing through transistor P102 either. Transistor P107 is off and hence no current is flowing through transistor N102. Transistors N102 and N101 form a current mirror and the current through transistor N102 is the sum of the transistor currents I(P102) and I(P107). Since transistors P102 and P107 are off, the voltage at the gate of transistors N102 and N101 will be near AVSS, thus keeping transistor N101 off.

Transistor P101 is configured as a diode-connected transistor and will keep the gate of transistors P101 and P106 near AVDD because transistor N101 is off. Transistors P106 and P101 form another current mirror. Since transistor N101 is off, transistors P101 and P106 are off too. The voltage at output terminal 111 will be low since N104 is on and has current flowing through it while transistor P106 is off.

The circuit operation will now be described when the opposite input voltage condition is true; namely, $V_{IN}+$ is less than $V_{IN}-$. Transistor N105 will be on and conducting current, I101, through it. At the same time, transistor N106 will be off. Transistors P104 and P105 corn pose a current mirror as do transistors P103 and P102. Since transistor N105 is on, current will be flowing through transistor P103 that is then mirrored into transistor P102. Since transistor N106 is off, no current will be flowing through transistors P104 and P105.

On the bottom side of the circuit, transistor P107 will be on and transistor P108 will be off. The current, I102, will be flowing into transistor N102. Also, the current from transistor P102 is flowing into transistor N102. Therefore, the current flowing into transistor N102 is the sum of the currents from transistors P107 and P102. Transistors N102 and N101 also form a current mirror. The size of transistor N101 is the same as that of transistor N102 so the current flowing through transistor N101 can be described as follows in equation 2:

$$I(N101)=I(N102)=[I(P107)+I(P102)] \quad (2)$$

The other half of the circuit is off since $V_{IN}+$ is less than $V_{IN}-$. Transistor N106 is off and no current is flowing through transistor P104. Since transistors P104 and P105 form a current mirror, no current is flowing through transistor P105 either. Transistor P108 is off and hence no current is flowing through transistor N103. Transistors N103 and N104 form a current mirror and the current through transistor N103 is the sum of the transistor currents I(P105) and I(P108). Since transistors P105 and P108 are off, the voltage at the gate of transistors N103 and N104 will be near AVSS, thus keeping transistor N104 off.

Transistors P106 and P101 form another current mirror. Since transistor N101 is on, transistors P101 and P106 are on too. The voltage at output terminal 111 will be high since P106 is on and has current flowing through it while transistor N104 is off. Also, the size ratio of transistor P106 is twice that of P101. Hence the current flowing through P106 can be described as in the following equation 3:

$$I(P106)=2*I(P101) \quad (3)$$

Figure 2:
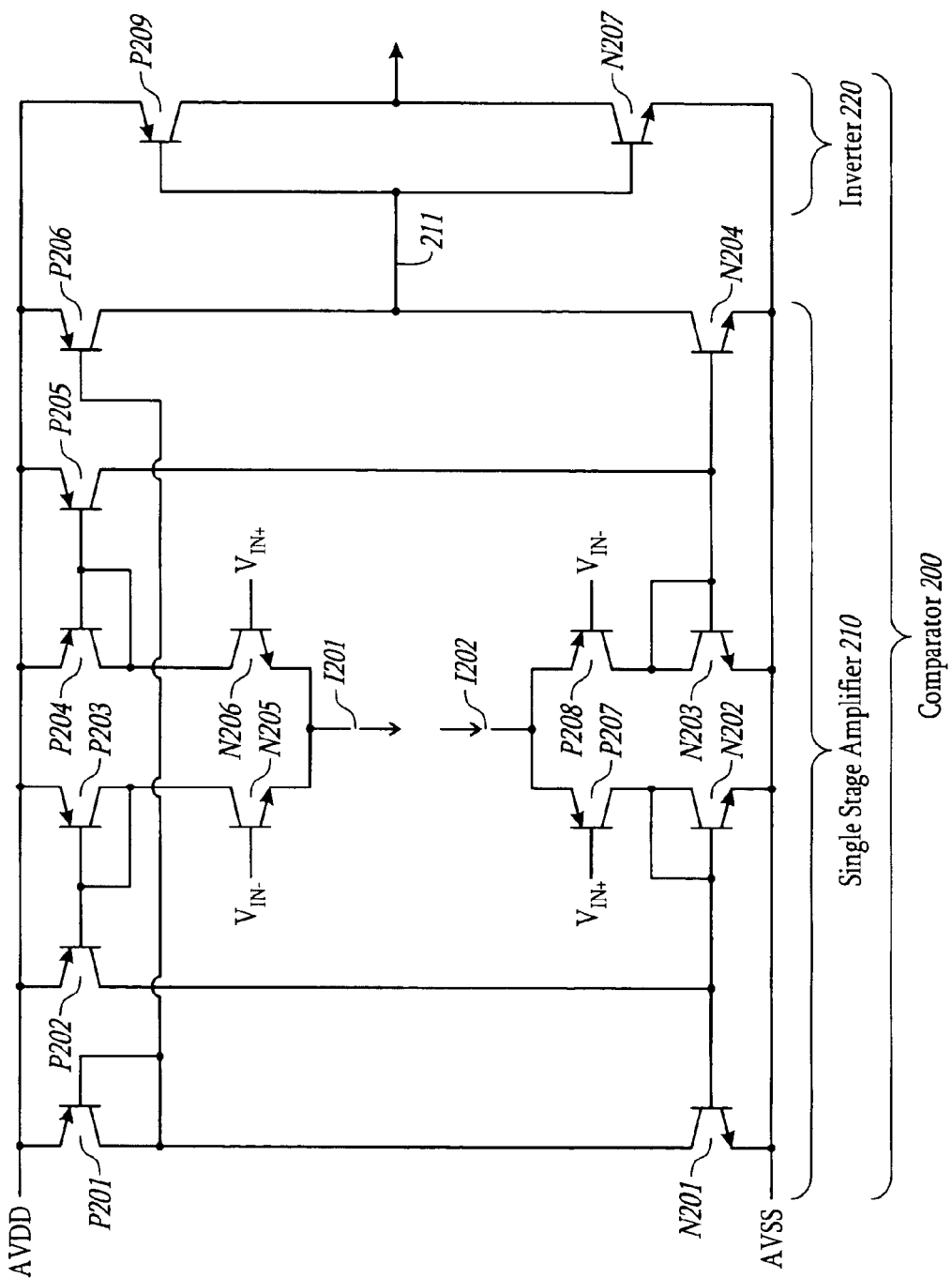
FIG. 2 illustrates a transistor-level diagram of a dual differential-input operational amplifier and comparator that is based upon bipolar transistors in accordance with a second embodiment of the present invention.

FIG. 2 illustrates an alternative comparator 200 with an alternative operational amplifier 210 and inverter 220. The comparator 200 of FIG. 2 is similar to the comparator 100 of FIG. 1, except that PMOSFETs P101 through 109 are replaced by PNP bipolar transistors P201 through 209, respectively, and except that NMOSFETS N101 through N107 are replaced by NPN bipolar transistors N201 through N207. Current sink I101 and current source I102 are replaced by current sink I201 and current source I202, respectively.

Figure 3:
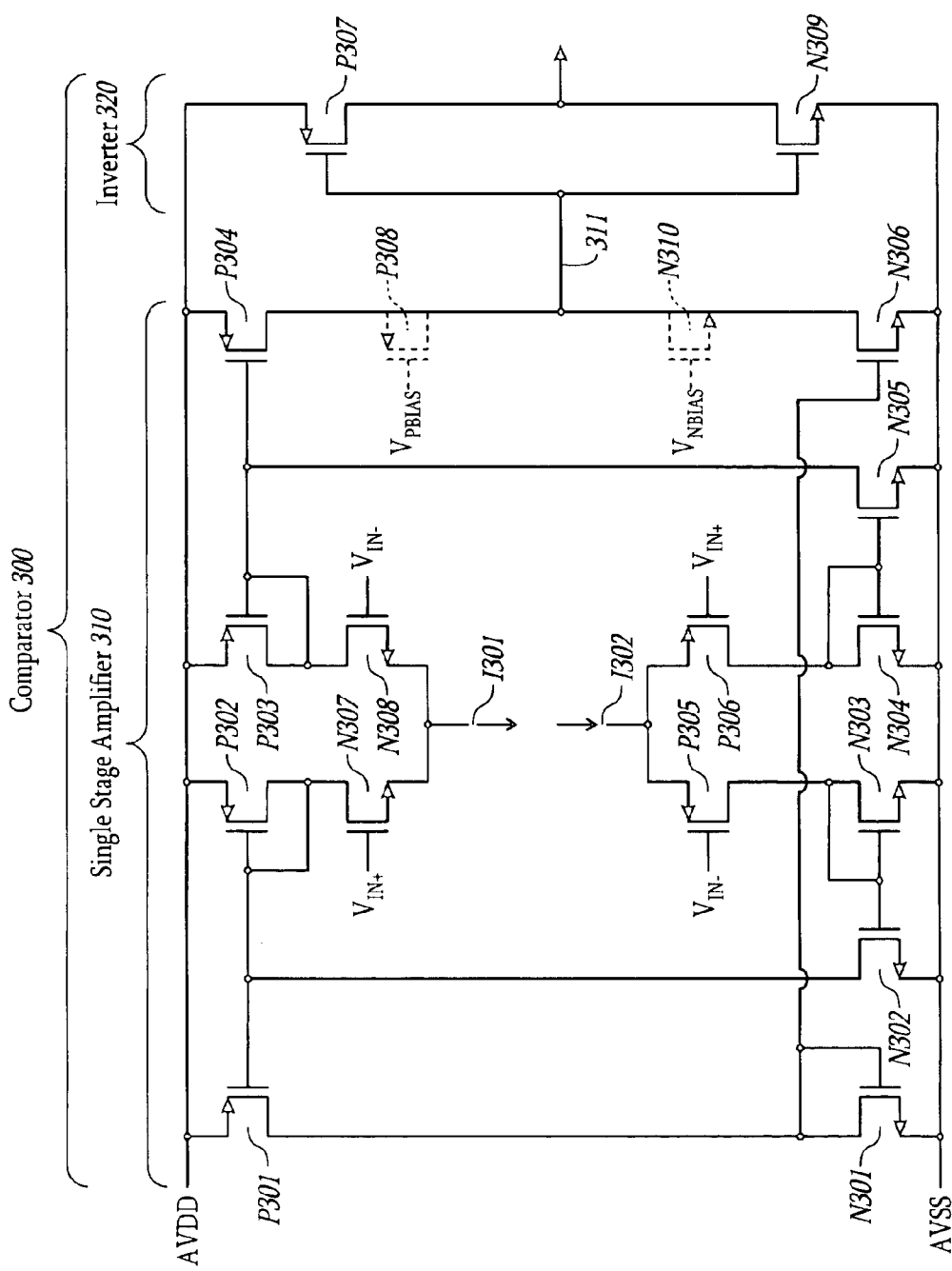
FIG. 3 illustrates a transistor-level diagram of a dual differential-input operational amplifier and comparator that is based upon MOSFETs and that is vertically inverted as compared to the embodiment of FIG. 1 in accordance with a third embodiment of the present invention.

FIG. 3 illustrates an alternative comparator 300 with an alternative operational amplifier 310 and inverter 320. The comparator 300 of FIG. 3 is similar to the comparator 100 of FIG. 1, except that PMOSFETs P101 through P109 are replaced by NMOSFETs N301 through N309, respectively, with their source terminals coupled to the lower voltage level rather than the higher voltage level. Also, the NMOSFETs N101 through N107 are replaced by PMOSFETs P301 through P307, respectively, with their source terminals coupled to the higher voltage level rather than the low voltage level. Also, the source terminals of the fifth and sixth PMOSFETs P305 and P306 are coupled to a current source I301, while the source terminals of the seventh and eighth PMOSFETs N307 and N308 are coupled to a current sink I302. Furthermore, cascoded NMOSFET N108 is replaced by cascoded PMOSFET P308, while cascoded PMOSFET P110 is replaced by cascoded NMOSFET N310.

Figure 4:
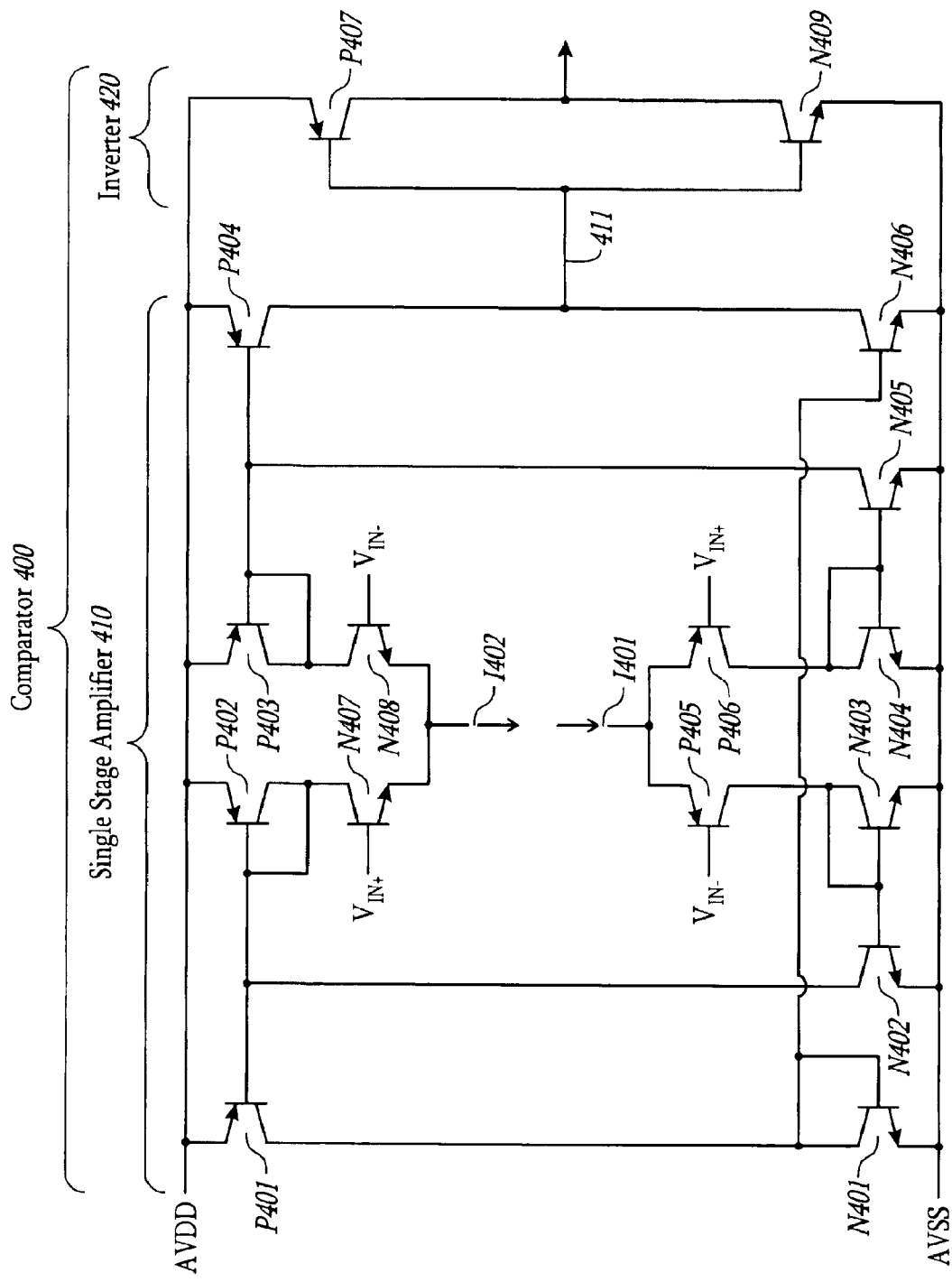
FIG. 4 illustrates a transistor-level diagram of a dual differential-input operational amplifier and comparator that is based upon bipolar transistors and that is vertically inverted as compared to the embodiment of FIG. 2 in accordance with a third embodiment of the present invention.

FIG. 4 illustrates an alternative comparator 400 with an alternative operational amplifier 410 and inverter 420. The comparator 400 of FIG. 4 is similar to the comparator 200 of FIG. 2, except that PNP bipolar transistors P201 through P209 are replaced by NPN bipolar transistors N401 through N409, respectively, with their emitter terminals coupled to the lower voltage level rather than the higher voltage level. Also, the NPN bipolar transistors N201 through N207 are replaced by PNP bipolar transistors P401 through P407, respectively, with their emitter terminals coupled to the higher voltage level rather than the lower voltage level. Also, the emitter terminals of the fifth and sixth PNP bipolar transistors P405 and P406 are coupled to a current source I401, while the emitter terminals of the seventh and eighth NPN bipolar transistors N407 and N408 are coupled to a current sink I402.

The resulting circuit is a dual differential-input operational amplifier (or comparator) with a wide input voltage range. Specifically, the input voltage may vary from the low supply voltage to the high supply voltage while retaining the functionality of the amplifier.

Secondly, the circuit has a relatively symmetric design, which lends itself well to a more symmetric layout. This permits better device matching during layout to thereby reduce the impact of processing and temperature variations throughout the die.

Thirdly, the input structure is configured as a low gain stage with self biased loads. When the amplifier is configured with an inverter to form a comparator, the input structure prevents feedback through the differential pair transistors when the comparator transitions from one binary output state to another. This is due to the low impedance loads in the differential pair. This feature allows the user to use very high sources impedance for the circuit driving the comparator without corrupting the data. This contrasts with many conventional comparators which generate noise in the reference circuits when the comparator makes a transition.

Fourthly, the circuit has a less complex bias mechanism and could be used with a synthesis tool to program the comparator to fit many applications. This would allow the amplifier and associated comparator to be used in a wide range of applications without having to make a change to the circuit topology or layout database.

Fifthly, the dual differential-input effect is accomplished with relatively few transistors thereby reducing the complexity and size of the circuit as a whole.

Accordingly, the dual differential-input operational amplifier and comparator provide a significant alternative for analog circuit designers, and thereby represent an advancement in the state of the art.

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes, which come within the meaning and range of equivalency of the claims, are to be embraced within their scope.

What is claimed and desired secured by United States Letters Patent is:

1. A circuit comprising a dual differential-input amplifier that comprising the following:

a first PMOSFET having a source terminal coupled to a high voltage source, having a drain terminal, and having a gate terminal coupled to the drain terminal;

a second PMOSFET having a source terminal coupled to the high voltage source, having a drain terminal, and having a gate terminal;

a third PMOSFET having a source terminal coupled to the high voltage source, having a drain terminal coupled to the gate terminal of the second PMOSFET, and having a gate terminal coupled to the drain terminal of the third PMOSFET;

a fourth PMOSFET having a source terminal coupled to the high voltage source, having a drain terminal, and having a gate terminal coupled to the drain terminal of the fourth PMOSFET;

a fifth PMOSFET having a source terminal, coupled to the high voltage source, having a drain terminal, and having a gate terminal coupled to the gate terminal of the fourth PMOSFET;

a sixth PMOSFET having a source terminal coupled to the high voltage source, having a drain terminal coupled to an output terminal of the dual differential-input amplifier, and having a gate terminal coupled to the gate terminal of the first PMOSFET;

a first NMOSFET having a source terminal coupled to a low voltage source, having a drain terminal coupled to the drain terminal of the first PMOSFET, and having a gate terminal coupled to the drain terminal of the second PMOSFET;

a second NMOSFET having a source terminal coupled to the low voltage source, having a drain terminal, and having a gate terminal coupled to the drain terminal of the second NMOSFET and to the drain terminal of the second PMOSFET;

a third NMOSFET having a source terminal coupled to the low voltage source, having a drain terminal, and having a gate terminal coupled to the drain terminal of the third NMOSFET and to the drain terminal of the fifth PMOSFET;

a fourth NMOSFET having a source terminal coupled to the low voltage source, having a drain terminal coupled to the output terminal of the dual differential-input amplifier, and having a gate terminal coupled to the drain terminal of the fifth PMOSFET;

a fifth NMOSFET having a source terminal coupled to a current sink, having a drain terminal coupled to the drain terminal of the third PMOSFET, and having a gate terminal coupled to a first input terminal of the dual differential-input amplifier;

a sixth NMOSFET having a source terminal coupled to the current sink, having a drain terminal coupled to the drain terminal of the fourth PMOSFET, and having a gate terminal coupled to a second input terminal of the dual differential-input amplifier;

a seventh PMOSFET having a source terminal coupled to a current source that provides a current of approximately equal magnitude to a current drawn by the current sink, having a drain terminal coupled to the drain terminal of the second NMOSFET, and having a gate terminal coupled to the second input terminal of the dual differential-input amplifier; and an eighth PMOSFET having a source terminal coupled to the current source, having a drain terminal coupled to the drain terminal of the third NMOSFET, and having a gate terminal coupled to the first input terminal of the dual differential-input amplifier.

2. A circuit in accordance with claim 1, further comprising an inverter that comprises the following:

a ninth PMOSFET having a source terminal coupled to the high voltage source, having a drain terminal coupled to an output terminal of a comparator, and having a gate terminal coupled to the output terminal of the dual differential-input amplifier; and a, seventh NMOSFET having a source terminal coupled to the low voltage source, having a drain terminal coupled to the output terminal of the comparator, and having a gate terminal coupled to the output terminal of the dual differential-input amplifier.

3. A circuit in accordance with claim 2, further comprising the following:

a cascoded PMOSFET coupled between the sixth PMOSFET and the output terminal of the dual differential-input amplifier in a cascoded configuration.

4. A circuit in accordance with claim 3, further comprising the following:

a cascoded NMOSFET coupled between the fourth NMOSFET and the output terminal of the dual differential-input amplifier in a cascoded configuration.

5. A circuit in accordance with claim 2, further comprising the following:

a cascoded NMOSFET coupled between the fourth NMOSFET and the output terminal of the dual differential-input amplifier in a cascoded configuration.

6. A circuit in accordance with claim 1, further comprising the following:

a cascoded PMOSFET coupled between the sixth PMOSFET and the output terminal of the dual differential-input amplifier in a cascoded configuration.

7. A circuit in accordance with claim 6, further comprising the following:

a cascoded NMOSFET coupled between the fourth NMOSFET and the output terminal of the dual differential-input amplifier in a cascoded configuration.

8. A circuit in accordance with claim 1, further comprising the following:

a cascoded NMOSFET coupled between the fourth NMOSFET and the output terminal of the dual differential-input amplifier in a cascoded configuration.

9. A circuit comprising a dual differential-input amplifier that comprising the following:

a first NMOSFET having a source terminal coupled to a low voltage source, having a drain terminal, and having a gate terminal coupled to the drain terminal;

a second NMOSFET having a source terminal coupled to the low voltage source, having a drain terminal, and having a gate terminal;

a third NMOSFET having a source terminal coupled to the low voltage source, having a drain terminal coupled to the gate terminal of the second NMOSFET, and having a gate terminal coupled to the drain terminal of the third NMOSFET;

a fourth NMOSFET having a source terminal coupled to the low voltage source, having a drain terminal, and having a gate terminal coupled to the drain terminal of the fourth NMOSFET;

a fifth NMOSFET having a source terminal coupled to the low voltage source, having a drain terminal, and having a gate terminal coupled to the gate terminal of the fourth NMOSFET;

a sixth NMOSFET having a source terminal coupled to the low voltage source, having a drain terminal coupled to an output terminal of the dual differential-input amplifier, and having a gate terminal coupled to the gate terminal of the first NMOSFET;

a first PMOSFET having a source terminal coupled to a high voltage source, having drain terminal coupled to the drain terminal of the first NMOSFET, and having a gate terminal coupled to the drain terminal of the second NMOSFET;

a second PMOSFET having a source terminal coupled to the high voltage source, having a drain terminal, and having a gate terminal coupled to the drain terminal of the second PMOSFET and to the drain terminal of the second NMOSFET;

a third PMOSFET having a source terminal coupled to the high voltage source, having a drain terminal, and having a gate terminal coupled to the drain terminal of the third PMOSFET and to the drain terminal of the fifth NMOSFET;

a fourth PMOSFET having a source terminal coupled to the high voltage source, having a drain terminal coupled to the output terminal of the dual differential-input amplifier, and having a gate terminal coupled to the drain terminal of the fifth NMOSFET;

a fifth PMOSFET having a source terminal coupled to a current source, having a drain terminal coupled to the drain terminal of the third NMOSFET, and having a gate terminal coupled to a first input terminal of the dual differential-input amplifier;

a sixth PMOSFET having a source terminal coupled to the current source, having a drain terminal coupled to the drain terminal of the fourth NMOSFET, and having a gate terminal coupled to a second input terminal of the dual differential-input amplifier;

a seventh NMOSFET having a source terminal coupled to a current sink that draws a current of approximately equal magnitude to a current supplied by the current source, having a drain terminal coupled to the drain terminal of the second PMOSFET, and having a gate terminal coupled to the second input terminal of the dual differential-input amplifier; and an eighth NMOSFET having a source terminal coupled to the current sink, having a drain terminal coupled to the drain terminal of the third PMOSFET, and having a gate terminal coupled to the first input terminal of the dual differential-input amplifier.

10. A circuit in accordance with claim 9, further comprising an inverter that comprises the following:

a ninth NMOSFET having a source terminal coupled to the low voltage source, having a drain terminal coupled to an output terminal of a comparator, and having a gate terminal coupled to the output terminal of the dual differential-input amplifier; and a seventh PMOSFET having a source terminal coupled to the high voltage source, having a drain terminal coupled to the output terminal of the comparator, and having a gate terminal coupled to the output terminal of the dual differential-input amplifier.

11. A circuit in accordance with claim 10, further comprising the following:
   a cascoded NMOSFET coupled between the sixth NMOSFET and the output terminal of the dual differential-input amplifier in a cascoded configuration.

12. A circuit in accordance with claim 11, further comprising the following:
   a cascoded PMOSFET coupled between the fourth PMOSFET and the output terminal of the dual differential-input amplifier in a cascoded configuration.

13. A circuit in accordance with claim 10, further comprising the following:
   a cascoded PMOSFET coupled between the fourth PMOSFET and the output terminal of the dual differential-input amplifier in a cascoded configuration.

14. A circuit in accordance with claim 9, further comprising the following:
   a cascoded NMOSFET coupled between the sixth NMOSFET and the output terminal of the dual differential-input amplifier in a cascoded configuration.

15. A circuit in accordance with claim 14, further comprising the following:
   a cascoded PMOSFET coupled between the fourth PMOSFET and the output terminal of the dual differential-input amplifier in a cascoded configuration.

16. A circuit in accordance with claim 9, further comprising the following:
   a cascoded PMOSFET coupled between the fourth PMOSFET and the output terminal of the dual differential-input amplifier in a cascoded configuration.

17. A circuit comprising a dual differential-input amplifier that comprising the following:
   a first PNP bipolar transistor having an emitter terminal coupled to a high voltage source, having a collector terminal, and having a body terminal coupled to the collector terminal;
   a second PNP bipolar transistor having an emitter terminal coupled to the high voltage source, having a collector terminal, and having a body terminal;
   a third PNP bipolar transistor having an emitter terminal coupled to the high voltage source, having a collector terminal coupled to the body terminal of the second PNP bipolar transistor, and having a body terminal coupled to the collector terminal of the third PNP bipolar transistor;
   a fourth PNP bipolar transistor having an emitter terminal coupled to the high voltage source, having a collector terminal, and having a body terminal coupled to the collector terminal of the fourth PNP bipolar transistor;
   a fifth PNP bipolar transistor having an emitter terminal coupled to the high voltage source, having a collector terminal, and having a body terminal coupled to the body terminal of the fourth PNP bipolar transistor;
   a sixth PNP bipolar transistor having an emitter terminal coupled to the high voltage source, having a collector terminal coupled to an output terminal of the dual differential-input amplifier, and having a body terminal coupled to the body terminal of the first PNP bipolar transistor;
   a first NPN bipolar transistor having an emitter terminal coupled to a low voltage source, having a collector terminal coupled to the collector terminal of the first PNP bipolar transistor, and having a body terminal coupled to the collector terminal of the second PNP bipolar transistor;
   a second NPN bipolar transistor having an emitter terminal coupled to the low voltage source, having a collector terminal, and having a body terminal coupled to the collector terminal of the second NPN bipolar transistor and to the collector terminal of the second PNP bipolar transistor;
   a third NPN bipolar transistor having an emitter terminal coupled to the low voltage source, having a collector terminal, and having a body terminal coupled to the collector terminal of the third NPN bipolar transistor and to the collector terminal of the fifth PNP bipolar transistor;
   a fourth NPN bipolar transistor having an emitter terminal coupled to the low voltage source, having a collector terminal coupled to the output terminal of the dual differential-input amplifier, and having a body terminal coupled to the collector terminal of the fifth PNP bipolar transistor;
   a fifth NPN bipolar transistor having an emitter terminal coupled to a current sink, having a collector terminal coupled to the collector terminal of the third PNP bipolar transistor, and having a body terminal coupled to a first input terminal of the dual differential-input amplifier;
   a sixth NPN bipolar transistor having an emitter terminal coupled to the current sink, having a collector terminal coupled to the collector terminal of the fourth PNP bipolar transistor, and having a body terminal coupled to a second input terminal of the dual differential-input amplifier;
   a seventh PNP bipolar transistor having an emitter terminal coupled to a current source that provides a current of approximately equal magnitude to a current drawn by the current sink, having a collector terminal coupled to the collector terminal of the second NPN bipolar transistor, and having a body terminal coupled to the second input terminal of the dual differential-input amplifier; and
   an eighth PNP bipolar transistor having an emitter terminal coupled to the current source, having a collector terminal coupled to the collector terminal of the third NPN bipolar transistor, and having a body terminal coupled to the first input terminal of the dual differential-input amplifier.

18. A circuit in accordance with claim 17, further comprising an inverter that comprises the following:
   a ninth PNP bipolar transistor having an emitter terminal coupled to the high voltage source, having a collector terminal coupled to an output terminal of a comparator, and having a body terminal coupled to the output terminal of the dual differential-input amplifier; and
   a seventh NPN bipolar transistor having an emitter terminal coupled to the low voltage source, having a collector terminal coupled to the output terminal of the comparator, and having a body terminal coupled to the output terminal of the dual differential-input amplifier.

19. A circuit comprising a dual differential-input amplifier that comprising the following:
   a first NPN bipolar transistor having an emitter terminal coupled to a low voltage source, having a collector terminal, and having a body terminal coupled to the collector terminal;

a second NPN bipolar transistor having an emitter terminal coupled to the low voltage source, having a collector terminal, and having a body terminal;

a third NPN bipolar transistor having an emitter terminal coupled to the low voltage source, having a collector terminal coupled to the body terminal of the second NPN bipolar transistor, and having a body terminal coupled to the collector terminal of the third NPN bipolar transistor;

a fourth NPN bipolar transistor having an emitter terminal coupled to the low voltage source, having a collector terminal, and having a body terminal coupled to the collector terminal of the fourth NPN bipolar transistor;

a fifth NPN bipolar transistor having an emitter terminal coupled to the low voltage source, having a collector terminal, and having a body terminal coupled to the body terminal of the fourth NPN bipolar transistor;

a sixth NPN bipolar transistor having an emitter terminal coupled to the low voltage source, having a collector terminal coupled to an output terminal of the dual differential-input amplifier, and having a body terminal coupled to the body terminal of the first NPN bipolar transistor;

a first PNP bipolar transistor having an emitter terminal coupled to a high voltage source, having a collector terminal coupled to the collector terminal of the first NPN bipolar transistor, and having a body terminal coupled to the collector terminal of the second NPN bipolar transistor;

a second PNP bipolar transistor having an emitter terminal coupled to the high voltage source, having a collector terminal, and having a body terminal coupled to the collector terminal of the second PNP bipolar transistor and to the collector terminal of the second NPN bipolar transistor;

a third PNP bipolar transistor having an emitter terminal coupled to the high voltage source, having a collector terminal, and having a body terminal coupled to the collector terminal of the third PNP bipolar transistor and to the collector terminal of the fifth NPN bipolar transistor;

a fourth PNP bipolar transistor having an emitter terminal coupled to the high voltage source, having a collector terminal coupled to the output terminal of the dual differential-input amplifier, and having a body terminal coupled to the collector terminal of the fifth NPN bipolar transistor;

a fifth PNP bipolar transistor having an emitter terminal coupled to a current source, having a collector terminal coupled to the collector terminal of the third NPN bipolar transistor, and having a body terminal coupled to a first input terminal of the dual differential-input amplifier;

a sixth PNP bipolar transistor having an emitter terminal coupled to the current source, having a collector terminal coupled to the collector terminal of the fourth NPN bipolar transistor, and having a body terminal coupled to a second input terminal of the dual differential-input amplifier;

a seventh NPN bipolar transistor having an emitter terminal coupled to a current sink that draws a current of approximately equal magnitude to a current supplied by the current source, having a collector terminal coupled to the collector terminal of the second PNP bipolar transistor, and having a body terminal coupled to the second input terminal of the dual differential-input amplifier; and an eighth NPN bipolar transistor having an emitter terminal coupled to the current sink, having a collector terminal coupled to the collector terminal of the third PNP bipolar transistor, and having a body terminal coupled to the first input terminal of the dual differential-input amplifier.

20. A circuit in accordance with claim 19, further comprising an inverter that comprises the following:

a ninth NPN bipolar transistor having an emitter terminal coupled to the low voltage source, having a collector terminal coupled to an output terminal of a comparator, and having a body terminal coupled to the output terminal of the dual differential-input amplifier; and a seventh PNP bipolar transistor having an emitter terminal coupled to the high voltage source, having a collector terminal coupled to the output terminal of the comparator, and having a body terminal coupled to the output terminal of the dual differential-input amplifier.

* * * * *

UNITED STATES PATENT AND TRADEMARK OFFICE
CERTIFICATE OF CORRECTION

PATENT NO. : 6,844,781 B1
DATED : January 18, 2005
INVENTOR(S) : Walsh et al.

It is certified that error appears in the above-identified patent and that said Letters Patent is hereby corrected as shown below:

Column 1,
Line 19, before "output coupled" change "it" to -- its --

Column 2,
Line 49, change "sources impedance" to -- source impedances --

Column 5,
Line 19, change "110" to -- 100 --

Column 6,
Line 21, change "corn pose" to -- compose --

Signed and Sealed this

Nineteenth Day of July, 2005

JON W. DUDAS
*Director of the United States Patent and Trademark Office*